(12) United States Patent
Yuk (10) Patent No.: US 10,084,311 B2
(45) Date of Patent: Sep. 25, 2018

(54) VOLTAGE GENERATOR

(71) Applicant: SK hynix Inc., Gyeonggi-do (KR)

(72) Inventor: Young-Sub Yuk, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 243 days.

(21) Appl. No.: 14/850,528

(22) Filed: Sep. 10, 2015

(65) Prior Publication Data

US 2016/0294193 A1  Oct. 6, 2016

(30) Foreign Application Priority Data

Apr. 1, 2015  (KR) .................. 10-2015-0046258

(51) Int. Cl.
*H02J 1/00* (2006.01)
*H02J 3/00* (2006.01)
*H02J 1/10* (2006.01)
*G11C 5/14* (2006.01)

(52) U.S. Cl.
CPC ............... *H02J 1/10* (2013.01); *G11C 5/147* (2013.01)

(58) Field of Classification Search
CPC .................................. G11C 5/147; H02J 1/10
See application file for complete search history.

(56) References Cited

U.S. PATENT DOCUMENTS

| 8,536,845 | B2 | 9/2013 | Kim et al. | |
| 9,075,593 | B2 * | 7/2015 | Castles | B63H 23/24 |
| 2008/0239837 | A1 * | 10/2008 | Kumazaki | G11C 5/145 |
| | | | | 365/189.09 |
| 2008/0303504 | A1 * | 12/2008 | Kang | G05F 3/30 |
| | | | | 323/313 |
| 2009/0134703 | A1 * | 5/2009 | Chung | H02J 1/102 |
| | | | | 307/64 |
| 2010/0315157 | A1 * | 12/2010 | Na | G05F 1/465 |
| | | | | 327/539 |
| 2012/0200343 | A1 * | 8/2012 | Hirobe | G05F 3/30 |
| | | | | 327/539 |
| 2012/0223684 | A1 * | 9/2012 | Lim | G05F 1/563 |
| | | | | 323/268 |
| 2012/0261987 | A1 * | 10/2012 | Ha | H02J 9/005 |
| | | | | 307/31 |
| 2012/0327734 | A1 * | 12/2012 | Sato | G11C 5/14 |
| | | | | 365/226 |

FOREIGN PATENT DOCUMENTS

KR  101020294  3/2011

* cited by examiner

*Primary Examiner* — Alfonso Perez Borroto
*Assistant Examiner* — Esayas Yeshaw
(74) *Attorney, Agent, or Firm* — IP & T Group LLP (57) ABSTRACT

A voltage generator includes a first voltage generation unit and a second voltage generation unit suitable for generating a second power supply voltage using a first power supply voltage, and being selectively driven, and a control signal generation unit suitable for activating the first voltage generation unit until the second power supply voltage reaches a specific level and activating the second voltage generation unit after the second power supply voltage reaches the specific level. The first voltage generation unit has less driving ability than the second voltage generation unit.

20 Claims, 8 Drawing Sheets

VOLTAGE GENERATOR

CROSS-REFERENCE TO RELATED APPLICATION(S)

The present application claims priority of Korean Patent Application No. 10-2015-0046258, filed on Apr. 1, 2015, which is incorporated herein by reference in its entirety.

BACKGROUND

1. Field

Exemplary embodiments of the present invention relate to a semiconductor design technology and, more particularly, to a voltage generator for generating internal voltages.

2. Description of the Related Art

Semiconductor devices are supplied with a voltage from an external source. The external voltage rises to its target voltage at a specific rate during initial operations. If the external voltage is directly applied to the internal circuits of a semiconductor device, the internal circuits will likely malfunction because the target voltage is still rising (i.e. has not stabilized). In order to prevent such malfunctions, semiconductor devices perform a power-up operation for guaranteeing stable operation of the internal circuits. The power-up operation includes activating a power-up signal when the external voltage reaches its target voltage level. After the power-up signal is activated and the external voltage stabilizes, the external voltage is supplied to the internal circuits of the semiconductor device.

Figure 1:
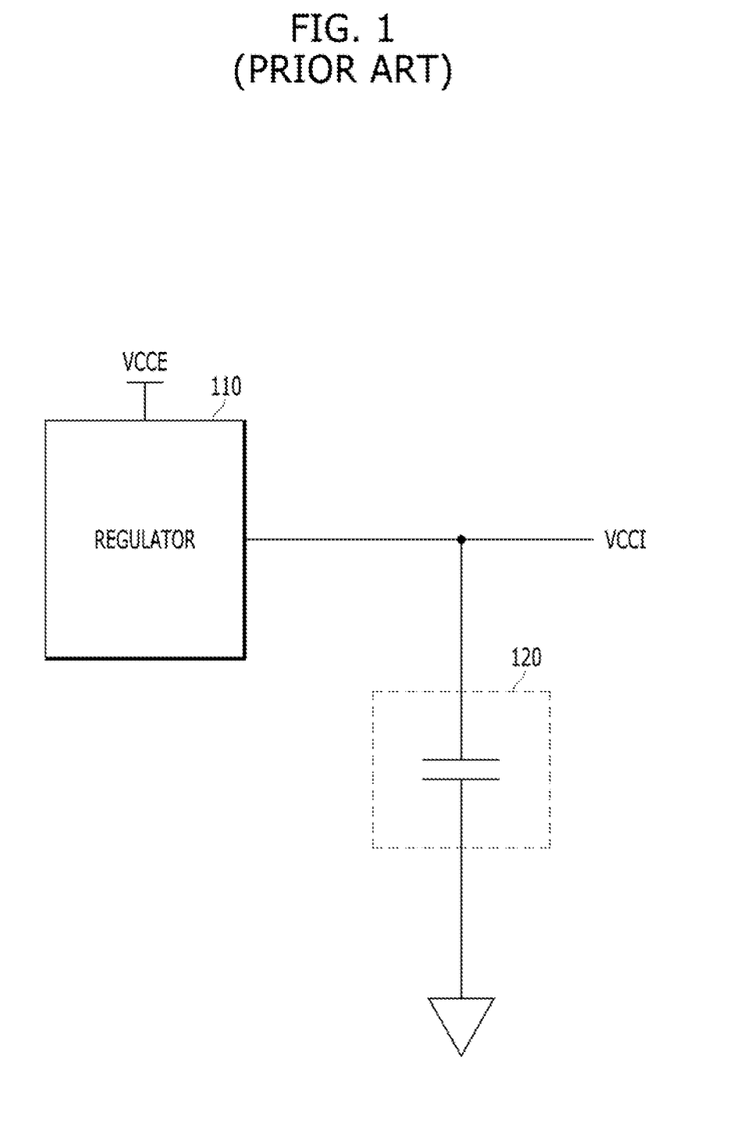
FIG. 1 is a block diagram of a conventional voltage generator of a semiconductor device.

FIG. 1 is a block diagram of a conventional voltage generator of a semiconductor device.

Referring to FIG. 1, the voltage generator includes a regulator 110 and a charging unit 120.

The regulator 110 receives a first power supply voltage VCCE from an external source and generates a second power supply voltage VCCI that is lower than the first power supply voltage VCCE. The charging unit 120 includes a capacitor and stably outputs the second power supply voltage VCCI using the regulator 110. That is, the charging unit 120 makes the second power supply voltage VCCI steady using the dampening characteristics of the capacitor.

During a power-up section of a semiconductor device, the regulator 110 receives the first power supply voltage VCCE that rises to its target voltage level and generates the second power supply voltage VCCI. The internal circuits of the semiconductor device receive the first and the second power supply voltages VCCE and VCCI and generate various internal voltages, in response to a power-up signal that is activated when the first power supply voltage VCCE and the second power supply voltage VCCI reach a specific level or higher.

During a fast power-up section, that is, if a power-up operation is performed at high speed, the semiconductor device rapidly generates the second power supply voltage VCCI by filling the charging unit 120 with a large amount of current. Accordingly, as the amount of peak current is increased during the power-up section, power consumed by the semiconductor device is increased.

SUMMARY

Various embodiments are directed to a voltage generator for reducing the amount of peak current during a power-up section.

In an embodiment, a voltage generator may include a first voltage generation unit and a second voltage generation unit suitable for generating a second power supply voltage using a first power supply voltage, and being selectively driven; and a control signal generation unit suitable for activating the first voltage generation unit until the second power supply voltage reaches a specific level and activating the second voltage generation unit after the second power supply voltage reaches the specific level, wherein the first voltage generation unit has less driving ability (i.e. cannot drive with as much power) than the second voltage generation unit.

The control signal generation unit may drive the first voltage generation unit during a power-up section and drives the second voltage generation unit when the second power supply voltage reaches the specific level after the power-up section, in response to the second power source voltage.

The control signal generation unit may receive the first power supply voltage and the second power supply voltage and generates a control signal for driving the first voltage generation unit and the second voltage generation unit.

The control signal generation unit may include a driving unit suitable for driving the control signal with a first voltage level in response to the first power supply voltage; a feedback unit suitable for maintaining the control signal at the first voltage level; a control unit suitable for driving the control signal with a second voltage level; and a trigger unit suitable for driving the control unit in response to the second power source voltage.

The driving unit may include a first charging element coupled between a first power supply voltage terminal for applying the first power supply voltage and a first node; and a first NMOS transistor and a first PMOS transistor coupled in series between the first node and a ground voltage terminal for applying a ground voltage, and wherein sources of the first NMOS transistor and the first PMOS transistor are coupled to a second node.

The feedback unit may include a first resistor element coupled between the first power supply voltage terminal and a third node; a second NMOS transistor coupled between the third node and the ground voltage terminal and suitable for being driven in response to a voltage level of the first node; and a second PMOS transistor coupled between the first power supply voltage terminal and the second node and suitable for being driven in response to a voltage level of the third node.

The trigger unit may receive a reference bias voltage, compares the second power supply voltage with the reference bias voltage, and drives the control unit if the second power supply voltage is higher than the reference bias voltage.

The trigger unit may drive the control unit if the second power supply voltage is a predetermined voltage level or higher.

The trigger unit may include a third NMOS transistor suitable for being driven in response to the second power supply voltage; a fourth NMOS transistor suitable for being driven in response to the reference bias voltage; a fifth NMOS transistor coupled between source regions of the third and the fourth NMOS transistors and the ground voltage terminal and being driven in response to the reference bias voltage; a third PMOS transistor suitable for being coupled between the first power source voltage terminal and a fourth node coupled to a drain of the third NMOS transistor; and a fourth PMOS transistor suitable for being coupled between the first power source voltage terminal and a drain region of the fourth NMOS transistor, wherein gate regions of the third and the fourth PMOS transistors are coupled to a drain region of the fourth PMOS transistor in common.

The control unit may include a fifth PMOS transistor and a second charging element coupled in series between the first power supply voltage terminal and the ground voltage terminal, wherein the fifth PMOS transistor is driven in response to a voltage level of the fourth node, and a drain of the fifth PMOS transistor and a first end of the second charging element are coupled to a sixth node; a sixth NMOS transistor coupled between the fourth node and the ground voltage terminal and suitable for being driven in response to a voltage level of the sixth node; and a seventh NMOS transistor coupled between the first node and the ground voltage terminal and suitable for being driven in response to the voltage level of the sixth node.

The control unit may further include an eighth NMOS transistor coupled between the sixth node and the ground voltage terminal and suitable for being driven in response to a power-on reset signal.

The trigger unit may include a third NMOS transistor suitable for being driven in response to the second power supply voltage; and a third PMOS transistor coupled between the third NMOS transistor and the ground voltage terminal and having a gate and a drain coupled to the ground voltage terminal.

The control unit may include a second resistor element coupled between the first power supply voltage terminal and a fourth node coupled to a drain of the third NMOS transistor; a fourth PMOS transistor and a second charging element coupled in series between the first power supply voltage terminal and the ground voltage terminal, wherein the fourth PMOS transistor is driven in response to a voltage level of the fourth node, and a drain of the fifth PMOS transistor and a first end of the second charging element are coupled to a fifth node; a fourth NMOS transistor coupled between the fourth node and the ground voltage terminal and suitable for being driven in response to a voltage level of the fifth node; and a fifth NMOS transistor coupled between the first node and the ground voltage terminal and suitable for being driven in response to the voltage level of the fifth node.

The second voltage generation unit may include a regulating unit suitable for receiving the first power supply voltage and generating the second power supply voltage by regulating the received first power supply voltage; and a blocking unit suitable for receiving a control signal and deactivating the regulating unit in response to the control signal that is enabled.

In an embodiment, a voltage generator may include a first voltage generation unit and a second voltage generation unit suitable for generating a second power supply voltage using a first power supply voltage, and being selectively driven, wherein the first voltage generation unit has less driving ability than the second voltage generation unit; and a control signal generation unit suitable for activating the first voltage generation unit during a power-up section and activating the second voltage generation unit when the first power supply voltage reaches a specific level after the power-up section.

The control signal generation unit may include a first charging element coupled between a first power supply voltage terminal for applying the first power supply voltage and a first node; first and second NMOS transistors coupled in series between the first node and a ground voltage terminal for applying a ground voltage; a first PMOS transistor and a second charging element coupled in series between the first power supply voltage terminal and the ground voltage terminal; and a third NMOS transistor and a resistor element coupled in series between the first node and the ground voltage terminal, wherein the third NMOS transistor is driven in response to a voltage level of a second node to which a drain of the first PMOS transistor and a first end of the second charging element are coupled, wherein the first PMOS transistor is driven in response to a voltage level of the first node.

The control signal generation unit may include a first charging element coupled between a first power supply voltage terminal for applying the first power supply voltage and a first node; and first NMOS and PMOS transistors coupled in series between the first node and a ground voltage terminal for applying a ground voltage, wherein sources of the first NMOS transistor and the first PMOS transistor are coupled to a second node.

The voltage generator may further include a first resistor element coupled between the first power supply voltage terminal and a third node; a second NMOS transistor coupled between the third node and the ground voltage terminal and suitable for being driven in response to a voltage level of the first node; and a second PMOS transistor coupled between the first power supply voltage terminal and the second node and suitable for being driven in response to a voltage level of the third node.

The voltage generator may further include a third PMOS transistor coupled between the first power supply voltage terminal and a fourth node and suitable for being driven in response to a voltage level of the first node; and a second charging element coupled between the fourth node and the ground voltage terminal.

The voltage generator may further include a third NMOS transistor and a second resistor element coupled in series between the first node and the ground voltage terminal, wherein the third NMOS transistor is driven in response to a voltage level of the fourth node.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference in numerals refer to like parts throughout the various figures and embodiments of the present invention.

Hereinafter, a power-up section is defined as the time until the first power supply voltage VCCE, which is externally applied, rises and reaches a target voltage level.

Figure 2:
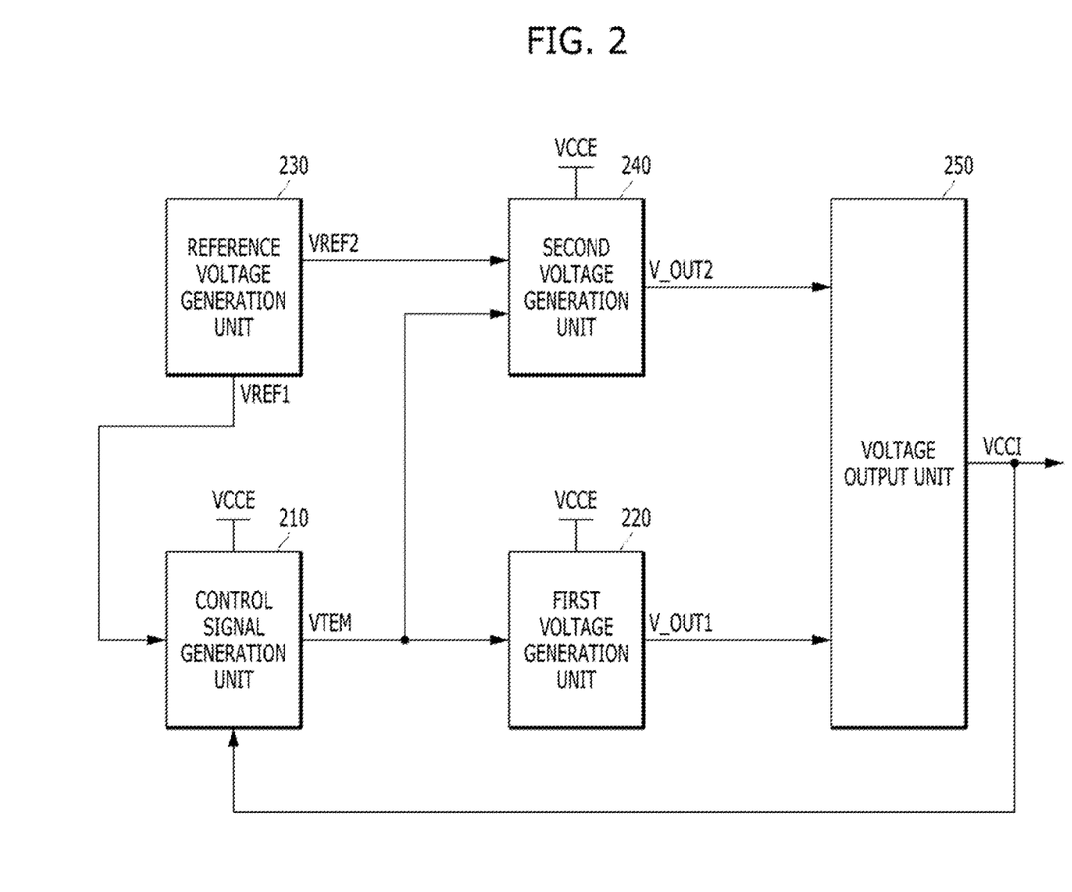
FIG. 2 is a block diagram of a voltage generator in accordance with an embodiment of the present invention.

FIG. 2 is a block diagram of a voltage generator in accordance with an embodiment of the present invention.

Referring to FIG. 2, the voltage generator may include a control signal generation unit 210, a first voltage generation unit 220, a reference voltage generation unit 230, a second voltage generation unit 240, and a voltage output unit 250.

The control signal generation unit 210 may externally receive a first power supply voltage VCCE. The control signal generation unit 210 may generate a control signal VTEM in response to the first power supply voltage VCCE. The control signal generation unit 210 may enable the control signal VTEM in an initial section in which the first power supply voltage VCCE rises and may disable the control signal VTEM in a section in which the first power supply voltage VCCE stabilizes and reaches its target level. The control signal VTEM controls the driving of the first voltage generation unit 220 and the second voltage generation unit 240. Specifically, the first voltage generation unit 220 may be driven in response to the control signal VTEM that is enabled. The driving of the first voltage generation unit 220 may be deactivated and the second voltage generation unit 240 may be driven in response to the control signal VTEM that is disabled.

The first voltage generation unit 220 may receive the first power supply voltage VCCE and the control signal VTEM outputted by the control signal generation unit 210. The first voltage generation unit 220 may generate a first output voltage V_OUT1 in response to the control signal VTEM.

The reference voltage generation unit 230 may generate a first reference voltage VREF1 and a second reference voltage VREF2.

The second voltage generation unit 240 may receive the first power supply voltage VCCE, the control signal VTEM from the control signal generation unit 210, and the second reference voltage VREF2 from the reference voltage generation unit 230. The driving of the second voltage generation unit 240 may be controlled in response to the control signal VTEM. The second voltage generation unit 240 may generate a second output voltage V_OUT2 based on the first power supply voltage VCCE and the second reference voltage VREF2. For example, the second voltage generation unit 240 may include a regulator. The first voltage generation unit 220 has weaker driving ability than the second voltage generation unit 240.

The voltage output unit 250 may receive the first output voltage V_OUT1 or the second output voltage V_OUT2 and output a second power supply voltage VCCI. The voltage output unit 250 may include a capacitor. The voltage output unit 250 may charge the first output voltage V_OUT1 and output the charged voltage as the second power supply voltage VCCI. Furthermore, the voltage output unit 250 may charge the second output voltage V_OUT2 and output the charged voltage as the second power supply voltage VCCI.

The operation of the voltage generator is described below.

First, in the power-up section, the control signal generation unit 210 may enable the control signal VTEM in response to the first power supply voltage VCCE. The first voltage generation unit 220 may be driven in response to the enabled control signal VTEM, and the second voltage generation unit 240 may be deactivated in response to the enabled control signal VTEM. The first voltage generation unit 220 may receive the first power supply voltage VCCE and generate the first output voltage V_OUT1. The voltage output unit 250 may output the second power supply voltage VCCI using the first output voltage V_OUT1.

After the power-up section, when the first power supply voltage VCCE reaches a target voltage level the control signal generation unit 210 may disable the control signal VTEM. The first voltage generation unit 220 may be deactivated in response to the disabled control signal VTEM. The second voltage generation unit 240 may be driven in response to the disabled control signal VTEM. The second voltage generation unit 240 may receive the first power supply voltage VCCE that has reached the target voltage level and the second reference voltage VREF2 outputted by the reference voltage generation unit 230 and generate the second output voltage V_OUT2. The voltage output unit 250 may output the second output voltage V_OUT2 as the second power supply voltage VCCI.

The voltage generator in accordance with an embodiment of the present invention may generate the second power supply voltage VCCI using the first voltage generation unit 220 in the power-up section and generate the second power supply voltage VCCI using the second voltage generation unit 240 after the power-up section. Accordingly, although a power-up operation is performed at high speed, a large amount of peak current is not generated because the second power supply voltage VCCI is generated using the first voltage generation unit 220 having a weaker driving ability than the second voltage generation unit 240.

Furthermore, in an embodiment of the present invention, the control signal generation unit 210 may generate the control signal VTEM by sensing the second power supply voltage VCCI outputted by the voltage output unit 250. The control signal generation unit 210 may generate the control signal VTEM in response to the first reference voltage VREF1 outputted by the reference voltage generation unit 230, and a detailed operation thereof is described with reference to FIGS. 5 to 8.

Figure 3:
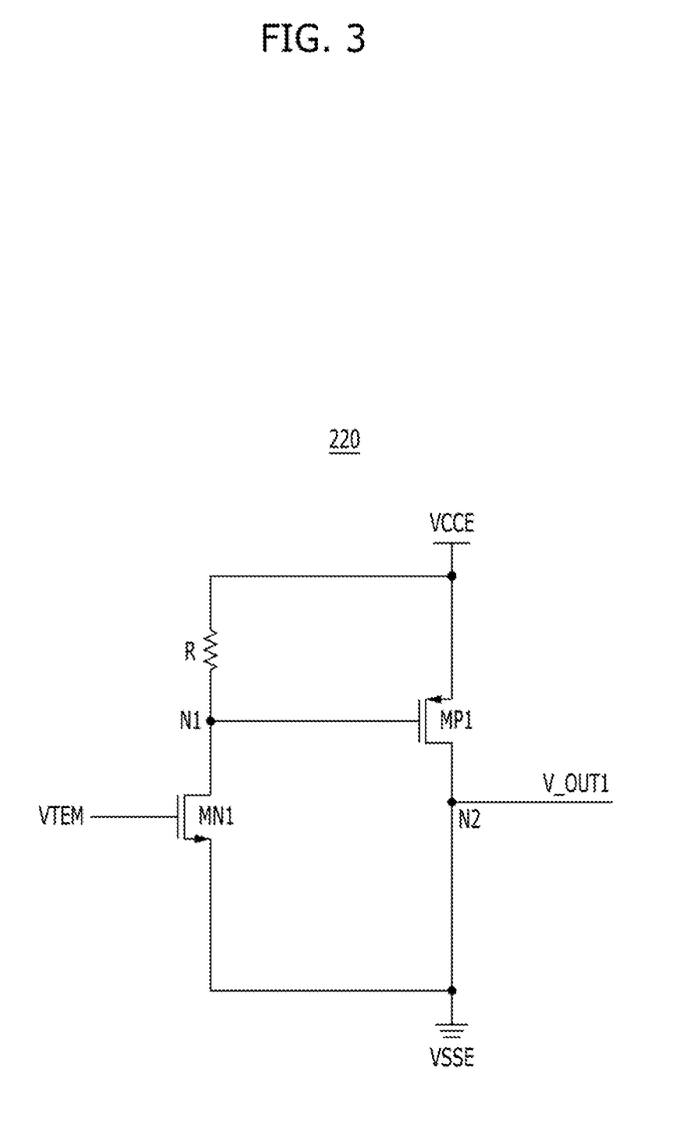
FIG. 3 is a circuit diagram of a first voltage generation unit illustrated in FIG. 2.

FIG. 3 is a circuit diagram of the first voltage generation unit 220 illustrated in FIG. 2.

Referring to FIG. 3, the first voltage generation unit 220 may include a resistor element R and an NMOS transistor MN1 coupled in series between terminals of the first power supply voltage VCCE and a ground voltage VSSE. The first voltage generation unit 220 may further include a PMOS transistor MP1 coupled between the terminals of the first power supply voltage VCCE and the ground voltage VSSE. Specifically, the NMOS transistor MN1 may be driven in response to the control signal VTEM and may be coupled between a first node N1 and the terminal of the ground voltage VSSE. The PMOS transistor MP1 may be driven in response to the signal of the first node N1.

If the control signal VTEM is enabled to a "high" level, a current path may be formed between the terminals of the first power supply voltage VCCE and the ground voltage VSSE because the NMOS transistor MN1 is driven. If a voltage of the first node N1 is higher than the threshold voltage of the PMOS transistor MP1 based on the current path, the PMOS transistor MP1 may be driven. When the PMOS transistor MP1 is driven, a current path may be formed between the terminals of the first power supply voltage VCCE and the ground voltage VSSE. A voltage of the second node N2 may be outputted as the first output voltage V_OUT1 based on the current path.

Figure 4:
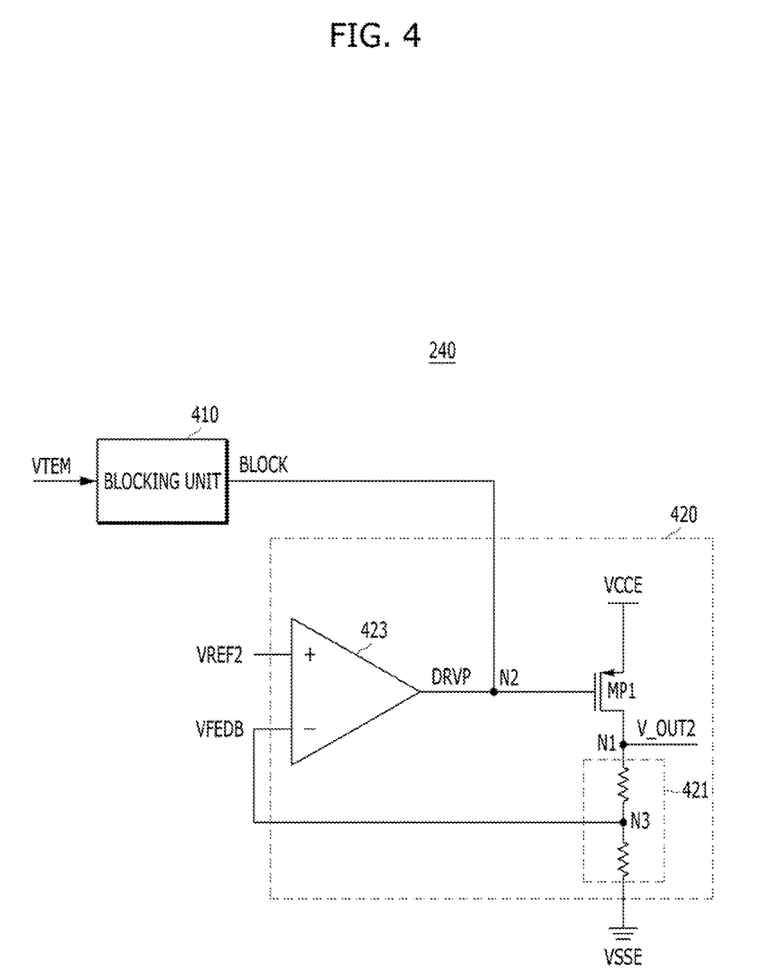
FIG. 4 is a circuit diagram of a second voltage generation unit illustrated in FIG. 2.

FIG. 4 is a circuit diagram of the second voltage generation unit 240 illustrated in FIG. 2.

Referring to FIG. 4, the second voltage generation unit 240 may include a blocking unit 410 and a regulating unit 420.

The blocking unit 410 may receive the control signal VTEM and generate a blocking signal BLOCK. If the control signal VTEM is enabled, the blocking unit 410 may output the blocking signal BLOCK that has been enabled. In contrast, if the control signal VTEM is disabled, the blocking unit 410 may output the blocking signal BLOCK that has been disabled.

The regulating unit 420 may include a PMOS transistor MP1, a register unit 421, and an amplification unit 423.

The PMOS transistor MP1 may have a source-drain path between the terminal of the first power supply voltage VCCE and a first node N1 in order to apply the first power supply voltage VCCE to the first node N1 and include a gate that responds to a signal of a second node N2.

The amplification unit 423 may generate a driving signal DRVP corresponding to a difference between the second reference voltage VREF2 and a feedback voltage VFEDB fed back by the register unit 421. The amplification unit 423 may apply the generated driving signal DRVP to the second node N2. The second reference voltage VREF2 may be generated by the reference voltage generation unit 230. The amplification unit 423 may control the driving of the PMOS transistor MP1 using the driving signal DRVP so that the feedback voltage VFEDB and the second reference voltage VREF2 become the same.

The blocking unit 410 is coupled between the amplification unit 423 and the PMOS transistor MP1, and may block the driving of the PMOS transistor MP1 through the blocking signal BLOCK.

The operation of the second voltage generation unit 240 is described below.

For example, if the control signal VTEM is enabled, the blocking unit 410 may output the blocking signal BLOCK having a "high" level. The PMOS transistor MP1 is unable to be driven in response to the blocking signal BLOCK having a "high" level.

In contrast, if the control signal VTEM is disabled, the blocking unit 410 may output the blocking signal BLOCK having a "low" level to the second node N2. The PMOS transistor MP1 may be driven in response to the blocking signal BLOCK having a "low" level. When the PMOS transistor MP1 is driven, the first power supply voltage VCCE may be applied to the first node N1. As a result, when the PMOS transistor MP1 is driven, a current path may be formed between the terminals of the first power supply voltage VCCE and the ground voltage VSSE. The feedback voltage VFEDB may be formed in a third node N3 through the current path formed in the register unit 421. The amplification unit 423 may output a voltage, corresponding to a difference between the feedback voltage VFEDB and the second reference voltage VREF2, to the gate of the PMOS transistor MP1 as the driving signal DRVP. The amplification unit 423 may control the driving of the PMOS transistor MP1 using the driving signal DRVP until the feedback voltage VFEDB and the second reference voltage VREF2 become the same.

Figure 5:
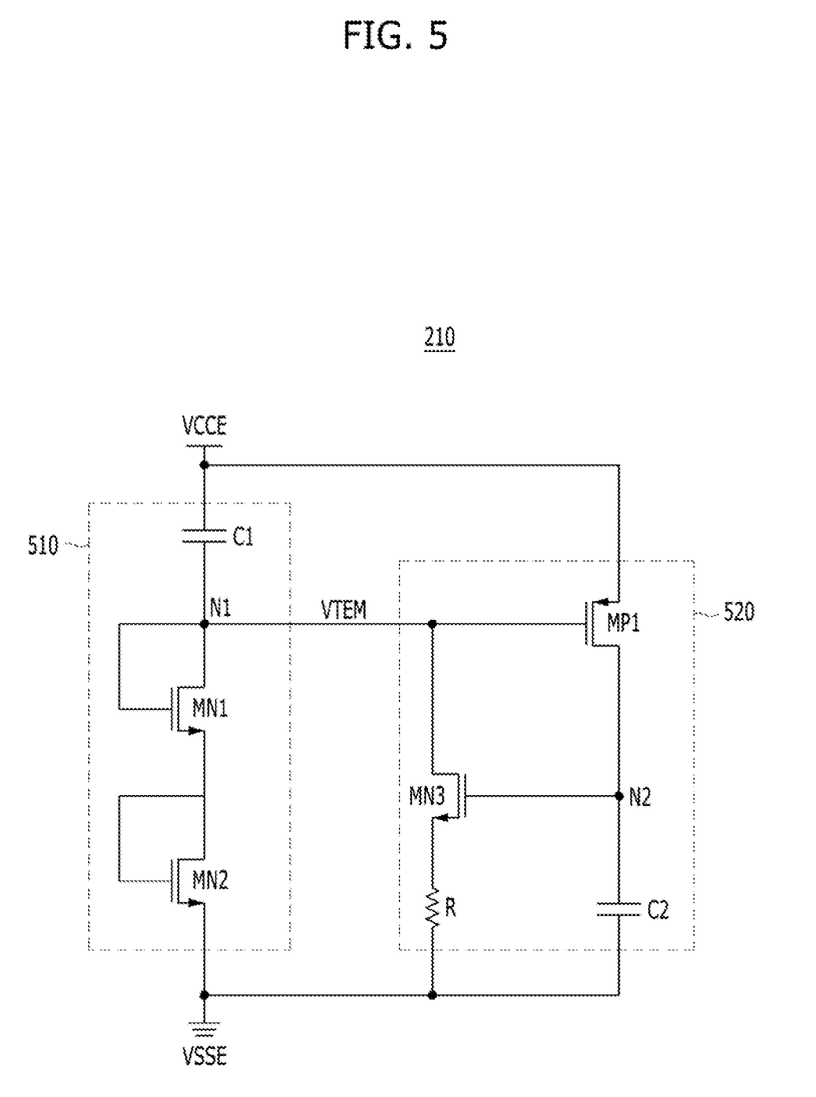
FIG. 5 is a circuit diagram illustrating the first embodiment of a control signal generation unit illustrated in FIG. 2.

FIG. 5 is a circuit diagram illustrating the first embodiment of the control signal generation unit 210 illustrated in FIG. 2.

Referring to FIG. 5, the control signal generation unit 210 may include a driving unit 510 and a control unit 520.

The driving unit 510 may include a first charging element C1, a first NMOS transistor MN1, and a second NMOS transistor MN2.

The first charging element C1 may be coupled between the terminal of the first power supply voltage VCCE and a first node N1. The first NMOS transistor MN1 and the second NMOS transistor MN2 are coupled in series between the first node N1 and the terminal of the ground voltage VSSE. Each of the first NMOS transistor MN1 and the second NMOS transistor MN2 may have a diode structure in which a gate is coupled to a drain. A voltage level of the first node N1 may correspond to a voltage level of the control signal VTEM.

The control unit 520 may include a first PMOS transistor MP1, a third NMOS transistor MN3, a resistor element R, and a second charging element C2.

The first PMOS transistor MP1 may have a source-drain path between the terminal of the first power supply voltage VCCE and a second node N2 and include a gate that responds to the signal of the first node N1. The second charging element C2 may be coupled between the second node N2 and the terminal of the ground voltage VSSE.

The third NMOS transistor MN3 may have a drain-source path between the first node N1 and the resistor element R and include a gate that responds to the signal of the second node N2. The resistor element R may be coupled between the third NMOS transistor MN3 and the terminal of the ground voltage VSSE.

The operation of the control signal generation unit 210 in accordance with the first embodiment of the present invention is described below.

If the first power supply voltage VCCE starts to rise, a current path may be formed through the first charging element C1, the first NMOS transistor MN1, and the second NMOS transistor MN2 of the driving unit 510. A voltage of the first node N1 rises in response to the first power supply voltage VCCE and it may rise by drain-source voltages of the first and the second NMOS transistors MN1 and MN2. When a difference between the voltage of the first node N1 and the first power supply voltage VCCE becomes higher than the threshold voltage of the first PMOS transistor MP1, the first PMOS transistor MP1 may be driven in response to the voltage of the first node N1. When the first PMOS transistor MP1 is driven, a current path may be formed between the terminals of the first power supply voltage VCCE and the ground voltage VSSE. Accordingly, the second node N2 may have a voltage of a "high" level. The third NMOS transistor MN3 may be driven in response to the voltage of the second node N2 having a "high" level. When the third NMOS transistor MN3 is driven, a current path may be formed between the first node N1 and the terminal of the ground voltage VSSE. The first node N1 may be discharged to a "low" level by the current path.

In other words, while the first power supply voltage VCCE gradually rises, the voltage of the first node N1 may rise by the drain-source voltages of the first and the second NMOS transistors MN1 and MN2. Thereafter, when the first power supply voltage VCCE rises up to a target level, the control unit 520 may change the voltage level of the first node N1 to a "low" level. Accordingly, the control signal generation unit 210 in accordance with the first embodiment of the present invention may output the control signal VTEM having a "high" level to the first voltage generation unit 220 and the second voltage generation unit 240 during the power-up section and output the control signal ITEM having a "low" level to the first voltage generation unit 220 and the second voltage generation unit 240 after the power-up section.

Figure 6:
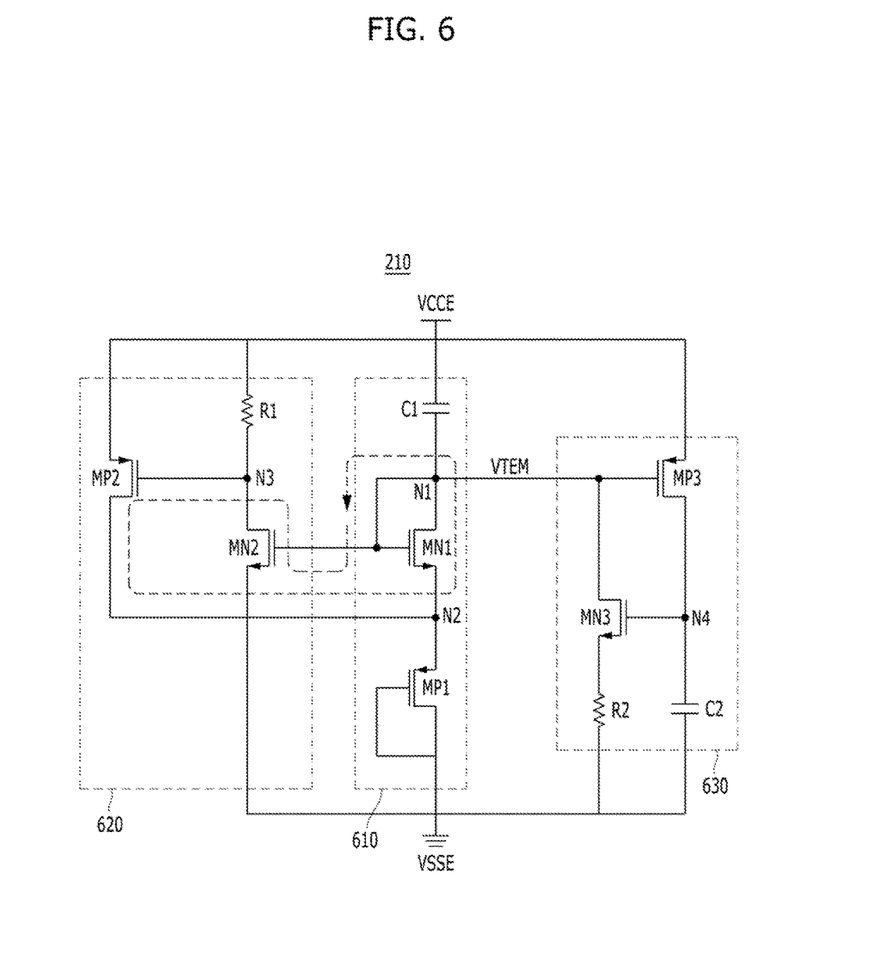
FIG. 6 is a circuit diagram illustrating the second embodiment of the control signal generation unit illustrated in FIG. 2.

FIG. 6 is a circuit diagram illustrating the second embodiment of the control signal generation unit 210 illustrated in FIG. 2.

Referring to FIG. 6, the control signal generation unit 210 may include a driving unit 610, a feedback unit 620, and a control unit 630.

The driving unit 610 may include a first charging element C1, a first NMOS transistor MN1, and a first PMOS transistor MP1.

The first charging element C1 may be coupled between the terminal of the first power supply voltage VCCE and a first node N1. The first NMOS transistor MN1 may have a drain-source path between the first node N1 and a second node N2, and may have a diode structure in which a gate is coupled to a drain. The first PMOS transistor MP1 may have a source-drain path between the second node N2 and the terminal of the ground voltage VSSE, and may have a diode structure in which a gate is coupled to a drain. A voltage level of the first node N1 may correspond to that of the control signal VTEM.

The feedback unit 620 may include a first resistor element R1, a second NMOS transistor MN2, and a second PMOS transistor MP2.

The first resistor element R1 may be coupled between the terminal of the first power supply voltage VCCE and a third node N3. The second NMOS transistor MN2 may have a drain-source path between the third node N3 and the terminal of the ground voltage VSSE and include a gate that responds to the signal of the first node N1. The second PMOS transistor MP2 may have a source-drain path between the terminal of the first power supply voltage VCCE and the second node N2 and include a gate that responds to the signal of the third node N3.

The control unit 630 may include a third PMOS transistor MP3, a third NMOS transistor MN3, a second resistor element R2, and a second charging element C2.

The third PMOS transistor MP3 may have a source-drain path between the terminal of the first power supply voltage VCCE and a fourth node N4 and include a gate that responds to the signal of the first node N1. The second charging element C2 may be coupled between the fourth node N4 and the terminal of the ground voltage VSSE. The third NMOS transistor MN3 may have a drain-source path between the first node N1 and the second resistor element R2 and include a gate that responds to the signal of the fourth node N4. The second resistor element R2 may be coupled between the third NMOS transistor MN3 and the terminal of the ground voltage VSSE.

The operation of the control signal generation unit 210 in accordance with the second embodiment of the present invention is described below.

When the first power supply voltage VCCE starts to rise, a current path may be formed through the first charging element C1 the first NMOS transistor MN1, and the first PMOS transistor MP1 of the driving unit 610. A voltage of the first node N1 rises in response to the first power supply voltage VCCE. The second NMOS transistor MN2 may be driven in response to the voltage of the first node N1. When the second NMOS transistor MN2 is driven, a current path may be formed through the first resistor element R1 and the drain-source of the second NMOS transistor MN2. When the second NMOS transistor MN2 is driven, the voltage of the third node N3 may have a "low" level. The second PMOS transistor MP2 may be driven in response to the voltage of the third node N3 having a "low" level. When the second PMOS transistor MP2 is driven, the voltage of the second node N2 may have a "high" level. Accordingly, the first node N1 may maintain a "high" level by the voltage of the second node N2 because the first NMOS transistor MN1 has been driven. That is, as indicated by a dotted line of FIG. 6, the voltage of the first node N1 may maintain a "high" level by the feedback unit 620.

Thereafter, a difference between the voltage of the first node N1 and the first power supply voltage VCCE may become higher than the threshold voltage of the third PMOS transistor MP3. At this point of time, the third PMOS transistor MP3 may be driven in response to the voltage of the first node N1. When the third PMOS transistor MP3 is driven, a current path may be formed between the terminals of the first power supply voltage VCCE and the ground voltage VSSE. Accordingly, the voltage of the fourth node N4 may have a "high" level. The third NMOS transistor MN3 may be driven in response to the voltage of the fourth node N4 having a "high" level. When the third NMOS transistor MN3 is driven, a current path may be formed between the first node N1 and the terminal of the ground voltage VSSE. The first node N1 may be discharged to a level by the current path.

In other words, while the first power supply voltage VCCE gradually rises, the voltage of the first node N1 may rise by the drain-source voltages of the first NMOS transistor MN1 and the first PMOS transistor MP1. Thereafter when the first power supply voltage VCCE rises up to a target level, the control unit 630 may change the voltage level of the first node N1 to a "low" level. Accordingly, in the control signal generation unit 210 in accordance with the second embodiment of the present invention, the control signal VTEM can maintain a "high" level in both cases of high and low speed power-up operations through the feedback unit 620. The control signal generation unit 210 may output the control signal VTEM having a "high" level to the first voltage generation unit 220 and the second voltage generation unit 240 during the power-up section and output the control signal VTEM having a "low" level to the first voltage generation unit 220 and the second voltage generation unit 240 after the power-up section.

Figure 7:
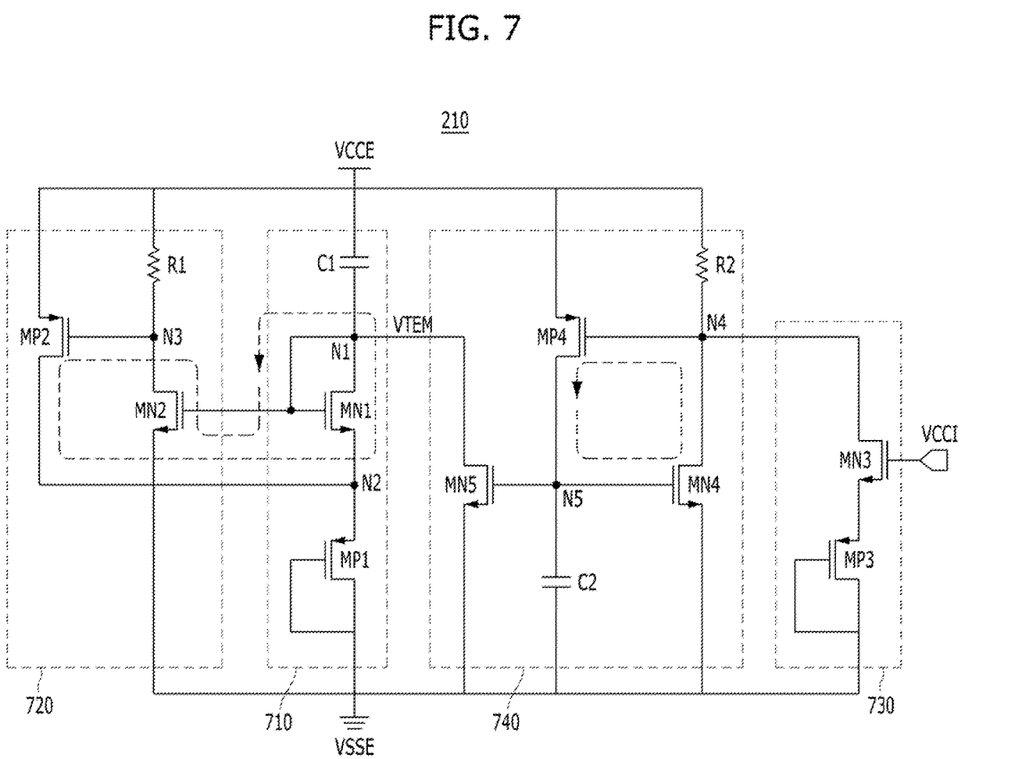
FIG. 7 is a circuit diagram illustrating the third embodiment of the control signal generation unit illustrated in FIG. 2.

FIG. 7 is a circuit diagram illustrating the third embodiment of the control signal generation unit 210 illustrated in FIG. 2.

Referring to FIG. 7, the control signal generation unit 210 may include a driving unit 710, a feedback unit 720, a trigger unit 730 and a control unit 740.

The driving unit 710 may include a first charging element C1, a first NMOS transistor MN1, and a first PMOS transistor MP1.

The first charging element C1 may be coupled between the terminal of the first power supply voltage VCCE and a first node N1. The first NMOS transistor MN1 may have a drain-source path between the first node N1 and a second node N2 and may have a diode structure in which a gate is coupled to a drain. The first PMOS transistor MP1 may have a source-drain path between the second node N2 and the terminal of the ground voltage VSSE and may have a diode structure in which a gate is coupled to a drain. A voltage level of the first node N1 may correspond to that of the control signal VTEM.

The feedback unit 720 may include a first resistor element R1, a second NMOS transistor MN2, and a second PMOS transistor MP2.

The first resistor element R1 may be coupled between the terminal of the first power supply voltage VCCE and a third node N3. The second NMOS transistor MN2 may have a drain-source path between the third node N3 and the terminal of the ground voltage VSSE and include a gate that responds to the signal of the first node N1. The second PMOS transistor MP2 may have a source-drain path between the terminal of the first power supply voltage VCCE and the second node N2 and include a gate that responds to the signal of the third node N3.

The trigger unit 730 may include a third NMOS transistor MN3 and a third PMOS transistor MP3 coupled in series between a fourth node N4 and the terminal of the ground voltage VSSE and each configured to have a source-drain path.

The second power supply voltage VCCI may be applied to the gate of the third NMOS transistor MN3. The third PMOS transistor MP3 may have a diode structure in which a gate is coupled to a drain.

The control unit 740 may include a second resistor element R2, a fourth PMOS transistor MP4, a fourth NMOS transistor MN4, a fifth NMOS transistor MN5, and a second charging element C2.

The second resistor element R2 may be coupled between the terminal of the first power supply voltage VCCE and the fourth node N4. The fourth PMOS transistor MP4 may have a source-drain path between the terminal of the first power supply voltage VCCE and a fifth node N5 and include a gate that responds to the signal of the fourth node N4. The fourth NMOS transistor MN4 may have a drain-source path between the fourth node N4 and the terminal of the ground voltage VSSE and include a gate that responds to the signal of the fifth node N5. The in fifth NMOS transistor MN5 may have a drain-source path between the first node N1 and the terminal the ground voltage VSSE and include a gate that responds to the signal of the fifth node N5. The second charging element C2 may be coupled between the fifth node N5 and the terminal of the ground voltage VSSE.

The operation of the control signal generation unit 210 in accordance with the third embodiment of the present invention is described below.

The operations of the driving unit 710 and the feedback unit 720 may be the same as those of FIG. 6. The first voltage generation unit 220 may be driven in response to the control signal VTEM of the first node N1 having a "high" level. The voltage output unit 250 may generate the second power supply voltage VCCI by the first voltage generation unit 220. The second power supply voltage VCCI gradually rises and may become higher than the threshold voltages of the third NMOS transistor MN3 and third PMOS transistor MP3 of the trigger unit 730. At this point in time, the voltage of the fourth node N4 may have a "low" level by the trigger unit 730. The fourth PMOS transistor MP4 may be driven in response to the voltage of the fourth node N4 having a "low" level. A current path may be formed through the fourth PMOS transistor MP4 and the second charging element C2. The voltage of the fifth node N5 may have a "high" level by the current path. The fourth NMOS transistor MN4 and the fifth NMOS transistor MN5 may be driven in response to the voltage of the fifth node N5 having a "high" level. When the fourth NMOS transistor MN4 is driven, the voltage of the fourth node N4 may maintain a "low" level. When the fifth NMOS transistor MN5 is driven, a current path may be formed through the fifth NMOS transistor MN5. Accordingly, the voltage of the first node N1 may be discharged to a "low" level.

In the control signal generation unit 210 in accordance with the third embodiment of the present invention, the control signal VTEM can maintain a "high" level by the feedback unit 720 in both cases of high and low speed power-up operations. Furthermore, the control signal generation unit 210 can sense the second power supply voltage VCCI by the trigger unit 730. When the second power supply voltage VCCI becomes a specific voltage or higher, the control unit 740 operates, and thus the control signal VTEM may be changed to a "low" level.

Accordingly, during a power-up section, the control signal generation unit 210 may output the control signal VTEM having a "high" level to the first voltage generation unit 220 and the second voltage generation unit 240. The second power supply voltage VCCI may rise through the first voltage generation unit 220. After the second power supply voltage VCCI reaches a target voltage level after the power-up section, the control signal VTEM having a "low" level may be outputted to the first voltage generation unit 220 and the second voltage generation unit 240. The first voltage generation unit 220 may be deactivated in response to the control signal VTEM having a "low" level.

Figure 8:
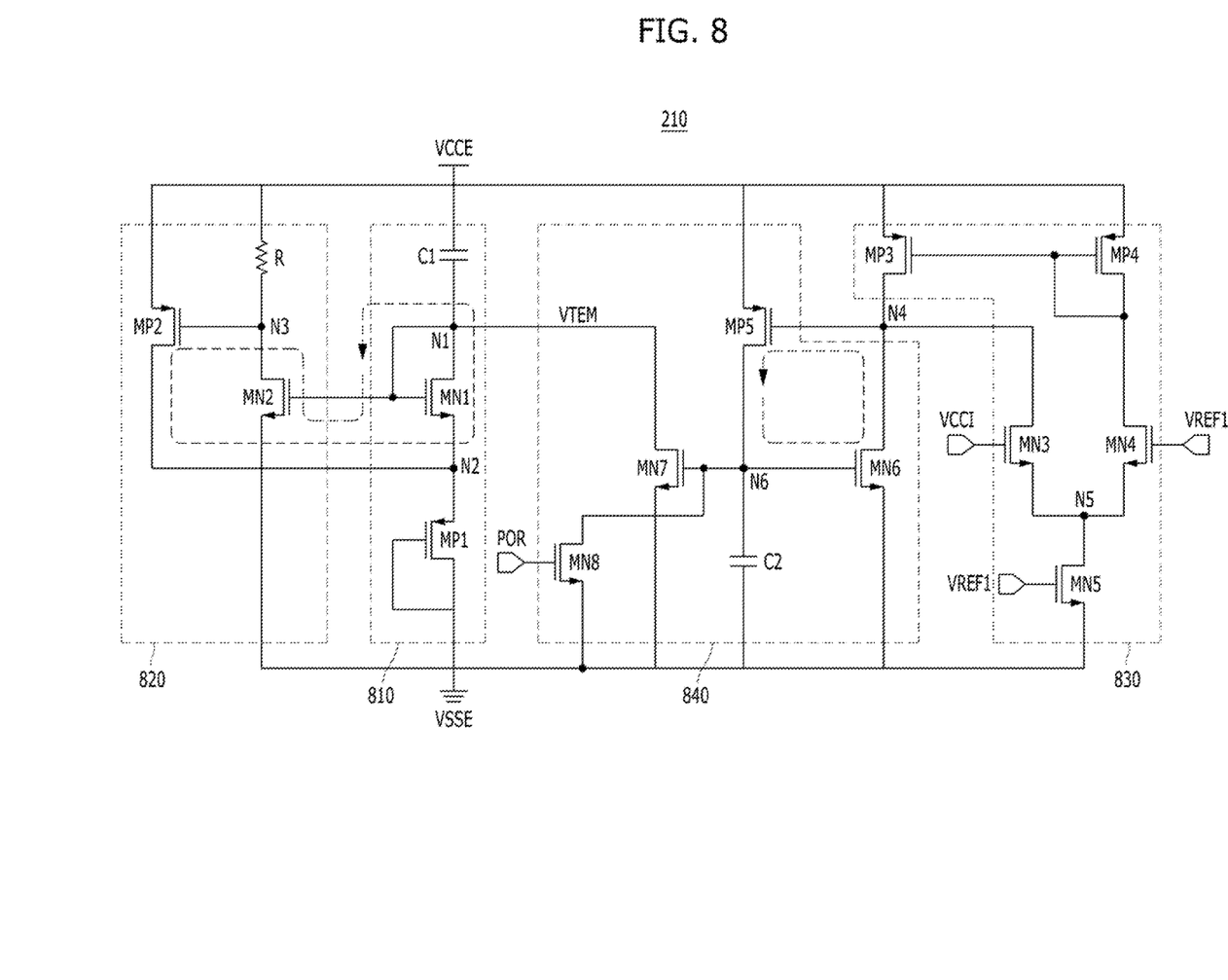
FIG. 8 is a circuit diagram illustrating the fourth embodiment of the control signal generation unit illustrated in FIG. 2.

FIG. 8 is a circuit diagram illustrating the fourth embodiment of the control signal generation unit 210 illustrated in FIG. 2.

Referring to FIG. 8, the control signal generation unit 210 may include a driving unit 810, a feedback unit 820, a trigger unit 830, and a control unit 840.

The driving unit 810 may include a first charging element C1, a first NMOS transistor MN1, and a first PMOS transistor MP1.

The first charging element C1 may be coupled between the terminal of the first power supply voltage VCCE and a first node N1. The first NMOS transistor MN1 may have a drain-source path between the first node N1 and a second node N2 and may have a diode structure in which a gate is coupled to a drain. The first PMOS transistor MP1 may have a source-drain path between the second node N2 and the terminal of the ground voltage VSSE and may have a diode structure in which a gate is coupled to a drain. A voltage level of the first node N1 may correspond to that of the control signal VTEM.

The feedback unit 820 may include a resistor element R, a second NMOS transistor MN2, and a second PMOS transistor MP2.

The resistor element R may be coupled between the terminal of the first power supply voltage VCCE and a third node N3. The second NMOS transistor MN2 may have a drain-source path between the third node N3 and the terminal of the ground voltage VSSE and include a gate that responds to the signal of the first node N1. The second PMOS transistor MP2 may have a source-drain path between the terminal of the first power supply voltage VCCE and the second node N2 and include a gate that responds to the signal of the third node N3.

The trigger unit 830 may include third to fifth NMOS transistors MN3 to MN5 and third and fourth PMOS transistors MP3 and MP4.

The third NMOS transistor MN3 may have a drain-source path between a fourth node N4 and a fifth node N5 and include a gate that responds to the second power supply voltage VCC1.

The fourth NMOS transistor MN4 may have a drain-source path between the drain of the fourth PMOS transistor MP4 and the fifth node N5 and include a gate that responds to the first reference voltage VREF1.

For example, the third NMOS transistor MN3 to which the second power supply voltage VCCI is applied and the fourth NMOS transistor MN4 to which the first reference voltage VREF1 is applied may have different driving capabilities because there is a difference between the second power supply voltage VCCI and the first reference voltage VREF1.

The fifth NMOS transistor MN5 may have a drain-source path between the fifth node N5 and the terminal of the ground voltage VSSE and include a gate that responds to the first reference voltage VREF1.

The third PMOS transistor MP3 may have a source-drain path between the terminal of the first power supply voltage VCCE and the fourth node N4. The gate of the third PMOS transistor MP3 may be coupled to the gate of the fourth PMOS transistor MP4.

The fourth PMOS transistor MP4 may have a source-drain path between the terminal of the first power supply voltage VCCE and the fourth NMOS transistor MN4. The gate and drain of the fourth PMOS transistor MP4 may be coupled.

The control unit 840 may include a fifth PMOS transistor MP5, sixth to eighth NMOS transistors MN6 to MN8, and a second charging element C2.

The fifth PMOS transistor MP5 may have a source-drain path between the terminal of the first power supply voltage VCCE and a sixth node N6 and include a gate that responds to the signal of the fourth node N4. The sixth NMOS transistor MN6 may have a drain-source path between the fourth node N4 and the terminal of the ground voltage VSSE and include a gate that responds to the signal of the sixth node N6. The seventh NMOS transistor MN7 may have a drain-source path between the first node N1 and the terminal of the ground voltage VSSE and include a gate that responds to the signal of the sixth node N6. The second charging element C2 may be coupled between the sixth node N6 and the terminal of the ground voltage VSSE. Furthermore, the control unit 840 may include the eighth NMOS transistor MN8 coupled between the gate of the seventh NMOS transistor MN7 and the terminal of the ground voltage VSSE. The eighth NMOS transistor MN8 may be driven in response to a power on reset (POR) signal POR.

The operation of the control signal generation unit 210 in accordance with the fourth embodiment of the present invention is described below.

The operations of the driving unit 810 and the feedback unit 820 may be the same as those of FIG. 6. The first voltage generation unit 220 may be driven in response to the control signal VTEM of the first node N1 having a "high" level. The voltage output unit 250 may generate the second power supply voltage VCCI by the first voltage generation unit 220. The second power supply voltage VCCI may become higher than the first reference voltage VREF1 by a specific voltage or higher. At this point in time, a greater current path may be formed through the third NMOS transistor MN3 than the fourth NMOS transistor MN4 because the third PMOS transistor MP3 and the fourth PMOS transistor MP4 form a current mirror. Accordingly, the fourth node N4 may have a "low" level. Furthermore, the third PMOS transistor MP3 and the fourth PMOS transistor MP4 may be deactivated in response to a current path that is formed through the fourth PMOS transistor MP4 and the fourth NMOS transistor MN4 and have a "high" level. The third PMOS transistor MP3 and the fourth PMOS transistor MP4 being deactivated may block the current path. As a result, when the second power supply voltage VCCI is a specific voltage or higher, the third and the fourth PMOS transistors MP3 and MP4 are deactivated to reduce current consumption that in the trigger unit 830.

The fifth PMOS transistor MP5 may be driven in response to the voltage of the fourth node N4 having a "low" level. When the fifth PMOS transistor MP5 is driven, a current path may be formed through the source-drain of the fifth PMOS transistor MP5 and the second charging element C2.

The voltage of the sixth node N6 may have a "high" level. The sixth NMOS transistor MN6 and the seventh NMOS transistor MN7 may be driven in response to the voltage of the sixth node N6 having a "high" level. When the sixth NMOS transistor MN6 is driven, the voltage of the fourth node N4 may maintain a level. When the seventh NMOS transistor MN7 is driven, the voltage of the first node N1 may changed to a "low" level. Furthermore, when the eighth NMOS transistor MN8 is driven in response to the POR signal POR, the driving of the sixth NMOS transistor MN6 can be controlled. That is, during the power-up section, the initial voltage level of the sixth node N6 can maintain a "low" level.

In the control signal generation unit 210 in accordance with the fourth embodiment of the present invention, the control signal VTEM can maintain a "high" level by the feedback unit 820 in both cases of high and low speed power-up operations. Furthermore, the control signal generation unit 210 can sense the second power supply voltage VCCI by the trigger unit 830. When the second power supply voltage VCCI becomes a specific voltage or higher, the control unit 840 operates, and the control signal VTEM may change to a "low" level by the control unit 840. Furthermore, the third and the fourth PMOS transistors MP3 and MP4 of the trigger unit 830 may be deactivated to reduce current consumption.

Accordingly, during a power-up section, the control signal generation unit 210 may output the control signal VTEM having a "high" level to the first voltage generation unit 220 and the second voltage generation unit 240. The second power supply voltage VCCI may rise through the first voltage generation unit 220. When the second power supply voltage VCCI reaches a target voltage level after the power-up section, the control signal VTEM having a "low" level may be outputted to the first voltage generation unit 220 and the second voltage generation unit 240. The first voltage generation unit 220 may be deactivated in response to the control signal VTEM having a "low" level. Furthermore, an electric current consumed by the control signal generation unit 210 can be reduced because the current path of the trigger unit 830 is blocked when the second power supply voltage VCCI becomes a target voltage level.

The voltage generator according to the proposed embodiment can reduce the amount of a peak current generated in a power-up section when it internally generates voltages using an external voltage.

Although various embodiments have been described for illustrative purposes, it will be apparent to those skilled in the art that various changes and modifications may be made without departing from the spirit and scope of the invention as defined in the following claims.

What is claimed is:

1. A voltage generator, comprising:
  a reference voltage generation unit suitable for generating a first reference voltage and a second reference voltage;
  a first voltage generation unit suitable for generating a first output voltage using a first power supply voltage and the first reference voltage;
  a second voltage generation unit suitable for generating a second output voltage using a first power supply voltage and the second reference voltage;
  a voltage output unit suitable for outputting the first output voltage or the second output voltage as a second power supply voltage; and
  a control signal generation unit suitable for activating the first voltage generation unit until the second power supply voltage reaches a specific level and activating the second voltage generation unit after the second power supply voltage reaches the specific level by sensing the second power supply voltage,
wherein the first voltage generation unit has less driving ability than the second voltage generation unit, and
wherein the first and second voltage generation units operate mutually exclusive,
wherein the specific level includes the first reference voltage.

2. The voltage generator of claim 1, wherein the control signal generation unit drives the first voltage generation unit during a power-up section and drives the second voltage generation unit when the second power supply voltage reaches the specific level after the power-up section, in response to the second power supply voltage.

3. The voltage generator of claim 1, wherein the control signal generation unit receives the first power supply voltage and the second power supply voltage and generates a control signal for driving the first voltage generation unit and the second voltage generation unit.

4. The voltage generator of claim 3, wherein the control signal generation unit comprises:
a driving unit suitable for driving the control signal with a first voltage level in response to the first power supply voltage;
a feedback unit suitable for maintaining the control signal at the first voltage level;
a control unit suitable for driving the control signal with a second voltage level; and
a trigger unit suitable for driving the control unit in response to the second power supply voltage.

5. The voltage generator of claim 4, wherein the driving unit comprises:
a first charging element coupled between a first power supply voltage terminal for applying the first power supply voltage and a first node; and
a first NMOS transistor and a first PMOS transistor coupled in series between the first node and a ground voltage terminal for applying a ground voltage, and
wherein sources of the first NMOS transistor and the first PMOS transistor are coupled to a second node.

6. The voltage generator of claim 5, wherein the feedback unit comprises:
a first resistor element coupled between the first power supply voltage terminal and a third node;
a second NMOS transistor coupled between the third node and the ground voltage terminal and suitable for being driven in response to a voltage level of the first node; and
a second PMOS transistor coupled between the first power supply voltage terminal and the second node and suitable for being driven in response to a voltage level of the third node.

7. The voltage generator of claim 6, wherein the trigger unit receives a reference bias voltage, compares the second power supply voltage with the reference bias voltage, and drives the control unit if the second power supply voltage is higher than the reference bias voltage.

8. The voltage generator of claim 6, wherein the trigger unit drives the control unit if the second power supply voltage is a predetermined voltage level or higher.

9. The voltage generator of claim 7, wherein the trigger unit comprises:
a third NMOS transistor suitable for being driven in response to the second power supply voltage;
a fourth NMOS transistor suitable for being driven in response to the reference bias voltage;
a fifth NMOS transistor coupled between source regions of the third and the fourth NMOS transistors and the ground voltage terminal and being driven in response to the reference bias voltage;
a third PMOS transistor suitable for being coupled between the first power source voltage terminal and a fourth node coupled to a drain of the third NMOS transistor; and
a fourth PMOS transistor suitable for being coupled between the first power source voltage terminal and a drain region of the fourth NMOS transistor,
wherein gate regions of the third and the fourth PMOS transistors are coupled to a drain region of the fourth PMOS transistor in common.

10. The voltage generator of claim 9, wherein the control unit comprises:
a fifth PMOS transistor and a second charging element coupled in series between the first power supply voltage terminal and the ground voltage terminal, wherein the fifth PMOS transistor is driven in response to a voltage level of the fourth node, and a drain of the fifth PMOS transistor and a first end of the second charging element are coupled to a sixth node;
a sixth NMOS transistor coupled between the fourth node and the ground voltage terminal and suitable for being driven in response to a voltage level of the sixth node; and
a seventh NMOS transistor coupled between the first node and the ground voltage terminal and suitable for being driven in response to the voltage level of the sixth node.

11. The voltage generator of claim 10, wherein the control unit further comprises:
an eighth NMOS transistor coupled between the sixth node and the ground voltage terminal and suitable for being driven in response to a power-on reset signal.

12. The voltage generator of claim 8, wherein the trigger unit comprises:
a third NMOS transistor suitable for being driven in response to the second power supply voltage; and
a third PMOS transistor coupled between the third NMOS transistor and the ground voltage terminal and having a gate and a drain coupled to the ground voltage terminal.

13. The voltage generator of claim 12, wherein the control unit comprises:
a second resistor element coupled between the first power supply voltage terminal and a fourth node coupled to a drain of the third NMOS transistor;
a fourth PMOS transistor and a second charging element coupled in series between the first power supply voltage terminal and the ground voltage terminal, wherein the fourth PMOS transistor is driven in response to a voltage level of the fourth node, and a drain of the fifth PMOS transistor and a first end of the second charging element are coupled to a fifth node;
a fourth NMOS transistor coupled between the fourth node and the ground voltage terminal and suitable for being driven in response to a voltage level of the fifth node; and
a fifth NMOS transistor coupled between the first node and the ground voltage terminal and suitable for being driven in response to the voltage level of the fifth node.

14. The voltage generator of claim 3, wherein the second voltage generation unit comprises:
a regulating unit suitable for receiving the first power supply voltage and generating the second power supply voltage by regulating the received first power supply voltage; and a blocking unit suitable for receiving a control signal and deactivating the regulating unit in response to the control signal that is enabled.

15. A voltage generator, comprising:
a reference voltage generation unit suitable for generating a first reference voltage and a second reference voltage;
a first voltage generation unit and a second voltage generation unit suitable for generating a first output voltage and a second output voltage using a first power supply voltage, and being selectively driven, wherein the first voltage generation unit has less driving ability than the second voltage generation unit;
a voltage output unit suitable for outputting the first output voltage or the second output voltage as a second power supply voltage; and
a control signal generation unit suitable for activating the first voltage generation unit during a power-up section and activating the second voltage generation unit when the first power supply voltage reaches a specific level after the power-up section by sensing the second power supply voltage,
wherein the first and second voltage generation units operate mutually exclusive,
wherein the specific level includes the first reference voltage.

16. The voltage generator of claim 15, wherein the control signal generation unit comprises:
a first charging element coupled between a first power supply voltage terminal for applying the first power supply voltage and a first node;
first and second NMOS transistors coupled in series between the first node and a ground voltage terminal for applying a ground voltage;
a first PMOS transistor and a second charging element coupled in series between the first power supply voltage terminal and the ground voltage terminal; and
a third NMOS transistor and a resistor element coupled in series between the first node and the ground voltage terminal,
wherein the third NMOS transistor is driven in response to a voltage level of a second node to which a drain of the first PMOS transistor and a first end of the second charging element are coupled,
wherein the first PMOS transistor is driven in response to a voltage level of the first node.

17. The voltage generator of claim 15, wherein the control signal generation unit comprises:
a first charging element coupled between a first power supply voltage terminal for applying the first power supply voltage and a first node; and
first NMOS and PMOS transistors coupled in series between the first node and a ground voltage terminal for applying a ground voltage,
wherein sources of the first NMOS transistor and the first PMOS transistor are coupled to a second node.

18. The voltage generator of claim 17, further comprising:
a first resistor element coupled between the first power supply voltage terminal and a third node;
a second NMOS transistor coupled between the third node and the ground voltage terminal and suitable for being driven in response to a voltage level of the first node; and
a second PMOS transistor coupled between the first power supply voltage terminal and the second node and suitable for being driven in response to a voltage level of the third node.

19. The voltage generator of claim 18, further comprising:
a third PMOS transistor coupled between the first power supply voltage terminal and a fourth node and suitable for being driven in response to a voltage level of the first node; and
a second charging element coupled between the fourth node and the ground voltage terminal.

20. The voltage generator of claim 19, further comprising:
a third NMOS transistor and a second resistor element coupled in series between the first node and the ground voltage terminal,
wherein the third NMOS transistor is driven in response to a voltage level of the fourth node.

\* \* \* \* \*